(12) United States Patent
Jelonnek

(10) Patent No.: US 6,518,904 B1
(45) Date of Patent: Feb. 11, 2003

(54) CASCADE SIGMA-DELTA MODULATOR

(75) Inventor: Bjoern Jelonnek, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/806,927

(22) PCT Filed: Aug. 3, 2000

(86) PCT No.: PCT/DE00/02604

§ 371 (c)(1),
(2), (4) Date: May 24, 2001

(87) PCT Pub. No.: WO01/11785

PCT Pub. Date: Feb. 15, 2001

(30) Foreign Application Priority Data

Aug. 6, 1999 (DE) .......................................... 199 37 246

(51) Int. Cl.⁷ ............................................... H03M 3/00
(52) U.S. Cl. ....................... 341/143; 341/144; 341/155; 341/200
(58) Field of Search ................................ 341/143, 155, 341/120, 144

(56) References Cited

U.S. PATENT DOCUMENTS

| | | | | |
|---|---|---|---|---|
| 5,103,228 A | | 4/1992 | Voorman et al. | 341/143 |
| 5,274,375 A | * | 12/1993 | Thompson | 341/118 |
| 5,392,040 A | | 2/1995 | Hayashi | 341/141 |
| 5,648,779 A | | 7/1997 | Cabler | 341/143 |
| 5,760,722 A | * | 6/1998 | Harris et al. | 341/143 |
| 5,786,779 A | | 7/1998 | Chun et al. | 341/61 |
| 6,323,794 B1 | * | 11/2001 | Okuda et al. | 341/143 |

FOREIGN PATENT DOCUMENTS

| | | |
|---|---|---|
| DE | 42 08 232 | 3/1992 |
| DE | 692 21 526 | 5/1992 |
| DE | 197 22 434 | 5/1997 |

OTHER PUBLICATIONS

Dunn et al., "Efficient Linearisation of Sigma—Delta Modulartors Using–Bit Dither", Electronics Letters, 31(12):941–942 (Jun. 8, 1995).*
Fischer et al., "Alternative Topologies for Sigma–Delta Modulators—A Comparative Study", IEEE Transaction on Circuits and Systems, 44(10):789–797 (Oct. 1, 1997).*
IEEE Press 1997, "Delta–Sigma Data Converters", Theory, Design and Simulation.
Dunn et al., "Efficient Linearisation of Sigma—Delta Modulators Using Singl–Bit Dither", Electronic Letters, 31(12):941–942 (Jun. 8, 1995).
Fischer et al., "Alternative Topologies for Sigma–Delta Modulators–A Comparative Study", IEEE Transactions on Circuits and Systems, 44(10):789–797 (Oct. 1, 1997).
International Search Report (dated Apr. 27, 2001) for International Application PCT/DE00/02604.

* cited by examiner

Primary Examiner—Michael Tokar
Assistant Examiner—Linh V Nguyen
(74) Attorney, Agent, or Firm—Morrison & Foerster, LLP

(57) ABSTRACT

In a cascaded sigma-delta modulator, in particular for converting time-discrete samples into corresponding analogue signals in digital radio communication receiving devices, the error signal of a sigma-delta modulator of the cascade being fed to a next sigma-delta modulator of this cascade, the output signal $y_{i-1}(k)$ of the preceding i-1 sigma-delta modulator is also fed to the decision circuit of the ith sigma-delta modulator of the cascade.

8 Claims, 5 Drawing Sheets

CASCADE SIGMA-DELTA MODULATOR

This application claims priority to International Application No. PCT/DE00/02604 which was published in the German language on Feb. 15, 2001.

TECHNICAL FIELD OF THE INVENTION

The invention relates to a cascaded sigma-delta modulator, and in particular, to a cascaded sigma-delta modulator converting time-discrete samples into corresponding analogue signals in digital radio communication receiving devices, an error signal, representing the quantization noise, of a sigma-delta modulator of the cascade respectively being fed to the next sigma-delta modulator of said cascade.

BACKGROUND OF THE INVENTION

In digital-to-analogue converters, for example, used in digital radio communication receiving devices, a digital input signal with $2^n$ signal states and a fixed sampling frequency $f_a$ is usually converted into an analogue signal which is intended to correspond approximately to the digital signal frequency range $-f_a/2$ to $+f_a/2$.

Particularly in the case of high bit widths n, the number of signal states to be recognized by analogue circuitry constitutes a substantial problem. For this reason, a digital signal is interpolated by digital filters, and use is made of what are known as sigma-delta modulators, which substantially reduce the bit width n of a digital signal in conjunction with increased sampling frequency.

The quantization noise produced in the process is transformed into previously unused frequency bands. Particularly efficient for this purpose are structures which achieve shaping of the noise signal by the use of an IIR filter (Infinite Impulse Response filter) of higher order.

A digital-to-analogue converter which uses an IIR filter as interpolation element and one or more sigma-delta modulators to convert the interpolated signals is described, for example, in U.S. Pat. No. 5,786,779. A cascaded sigma-delta modulator for a digital-to-analogue converter is, moreover, shown in DE 197 22 434 C1. A detailed treatment of the design and mode of operation of sigma-delta modulators is given in S. R. Norswothy, R. Schreier, G. Temes: "Delta-Sigma Data Converters, Theory, Design and Simulation", IEEE Press 1997, ISBN 0-7803-1045-4.

There are two approaches to achieving noise shaping in the case of sigma-delta modulators. In a first approach, use is made of feedback loops of higher order. This permits a reduction up to two signal states (1-bit signaling technology), but starting from noise shaping of order 3, leads to possible instabilities in the case of high input signals. Transgressions of the value range can occur very easily. In order to meet this, an input signal of reduced amplitude is used, as well as state memories with clipping properties, as a result of which it is possible to achieve a circuit stability which can be determined empirically. According to another approach, use is made of cascaded structures of first and/or second order, which are of multi-stage design and therefore exhibit a stable operational performance.

SUMMARY OF THE INVENTION

In one embodiment of the invention, there is a cascaded sigma-delta modulator, for inverting time-discrete samples into corresponding analogue signals in digital radio communication receiving devices. The apparatus including, for example, a first sigma-delta modulator in a cascade having an error signal representing the quantization noise, being fed to another sigma-delta modulator in the cascade; and a decision circuit of the ith sigma-delta modulator of the cascade being fed the output signal yi−1(k) of the preceding i−1 sigma-delta modulators.

In one aspect of the invention, the cascaded sigma-delta modulator, the output signal yi(k) has a low number of signal states.

In another aspect of the invention, the cascaded sigma-delta modulator, the number of the signal states is reduced down to two.

In still another aspect of the invention, the cascaded sigma-delta modulator, cascade stages are provided arbitrarily.

In yet another aspect of the invention, the cascaded sigma-delta modulator, the decision circuit of at least one stage of the cascade is extended by an integrator.

In another aspect of the invention, the cascaded sigma-delta modulator, the decision circuit of at least one stage of the cascade is extended by an integrator, and the output value of the integrator is limited to a minimum or a maximum value.

In yet another aspect of the invention, the cascaded sigma-delta modulator, a dither signal $\tilde{r}(k)$ is added to the input signal of the last stage of the cascade.

In another aspect of the invention, the cascaded sigma-delta modulator, the decision circuit of the last stage of the cascade is influenced by a dither signal $\tilde{r}(k)$ In still another aspect of the invention, the cascaded sigma-delta modulator, the output signal $\tilde{y}_{i-1}(k)$ of all preceding cascade stages is fed, in addition to or instead of the summed output signal yi−1(k) of all preceding i−1 sigma-delta modulators, to the decision circuit of the ith sigma-delta modulator of the cascade.

BRIEF DESCRIPTION OF THE DRAWINGS

The invention is to be explained in more detail with the aid of an exemplary embodiment. In the associated drawing.

DETAILED DESCRIPTION OF THE INVENTION

The invention combines a sigma-delta modulator having the advantages of stability in operational performance and of the simpler possibility of realizing a cascaded approach with the advantages of a low number of stages of a feedback loop of higher order.

The invention is based on a cascaded sigma-delta modulator. The number of signal states is reduced as far as 2—corresponding to 1 bit—by introducing an additional logic circuit. Complicated clipping circuits are eliminated without endangering the stability of the circuit. Because the circuit is of a modular design, an existing design of a sigma-delta modulator of ith order can be converted in a simple way into a circuit i+1th order by adding an additional stage.

A further advantage of the invention includes the logic circuit of a sigma-delta modulator, its decision circuit and the additions of the decision output signals do not influence the lowest bits of a numerical representation. Specifically, numerical values are usually coded as a sum of powers of two (for example two's complement representation). During the operations, in particular additions, running in a sigma-delta modulator, the largest sum terms in absolute value do not in the process influence the result of the smallest sum terms in absolute value. In accordance with the exemplary embodiments according to the invention, the output signal of the decision circuit has a high numerical value in absolute terms. The numerical value therefore does not influence the low-order sum elements (bits), which can be calculated separately very efficiently. The overflows resulting from the calculation, the output signal of the decision circuit and the higher-order part of the input signal of the sigma-delta modulator can then be calculated in a second part of the latter.

Figure 1:
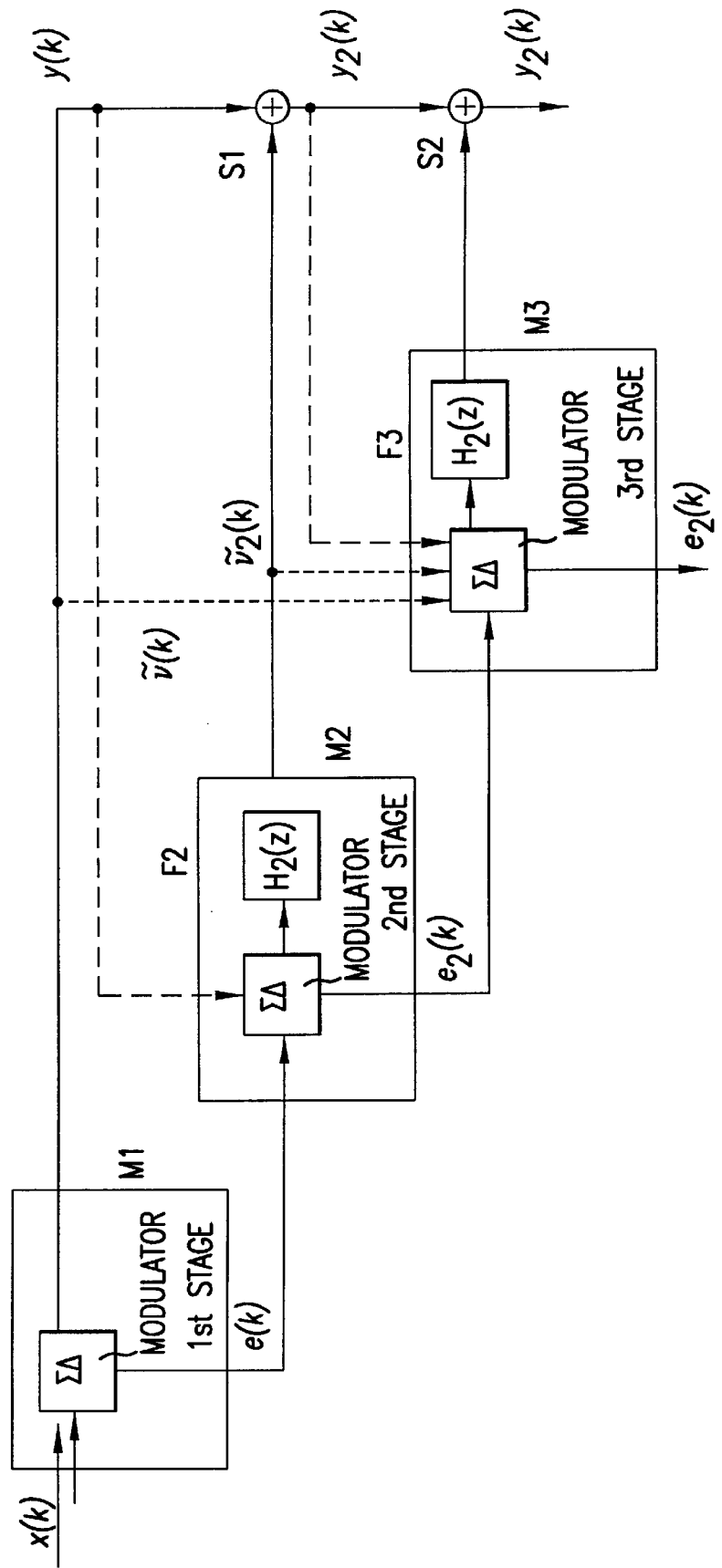
FIG. 1 shows the fundamental principle of a cascaded sigma-delta modulator with conditioning according to the invention.

FIG. 1 shows the fundamental principle of a cascaded sigma-delta modulator according to the invention. A 1st or 2nd order sigma-delta modulator M1 of conventional design is used as the first stage. The modulator uses a digital input signal sequence x(k) to produce, on the one hand, an output signal sequence y(k) of lower stage number and, on the other hand, an error signal sequence e(k) representing the quantization noise.

In previously known cascaded structures, the error signal e(k) is fed exclusively to the input of a second sigma-delta modulator M2. The latter produces a low-stage simulation of the signal e(k), which is subjected to spectral shaping by a digital filter F2 in such a way that the error e(k) at the output of a summer S1 is compensated and, moreover, a quantization error $e_2(k)$ which is fed to the output of a third sigma-delta modulator M3. The summer S1 has two positive inputs, one positive input being connected to the output of the first sigma-delta modulator M1, and the second positive input being connected to the output of the digital filter F2 of the second sigma-delta modulator M2. The output of the summer S1 supplies the compensated signal $y_2(k)$, and is connected to the positive input of a further summer S2, to which the output signal of a digital filter F3 of a third sigma-delta modulator M3 is fed at a second positive input.

Both the output signal of the second sigma-delta modulator M2, and the subsequent spectral shaping in the filter F2 increase the stage number of the signal $y_2(k)$. The same thing happens, in the case of the downstream sigma-delta modulator M3.

In order to prevent an increase in the stage number of the output signal $y_i(k)$, according to the invention the output signal of the i−1 sigma-delta modulator is additionally fed to the decision process of the ith sigma-delta modulator. This is emphasized in FIG. 1 by the dashed connections. Thereafter, the output of the sigma-delta modulator M1 is additionally led to the input of the decision circuit of the sigma-delta modulator M2 of the second stage, and the output of the summer S1, at which the compensated signal $y_2(k)$ is present, is additionally led to the inputs of the decision circuit of the sigma-delta modulator M3 of the third stage. It is within the scope of the invention to connect further sigma-delta modulators in this way.

As an alternative or else in addition, the output signals $\tilde{y}_{i-1}(k)$ of all preceding cascade stages can be fed to the decision circuit of the ith sigma-delta modulator of the cascade. This is illustrated in FIG. 1 for the third cascade stage M3 by the dotted connections from the output of the sigma-delta modulators M1, M2 to the input of the decision circuit of the third sigma-delta modulator M3.

Figure 2:
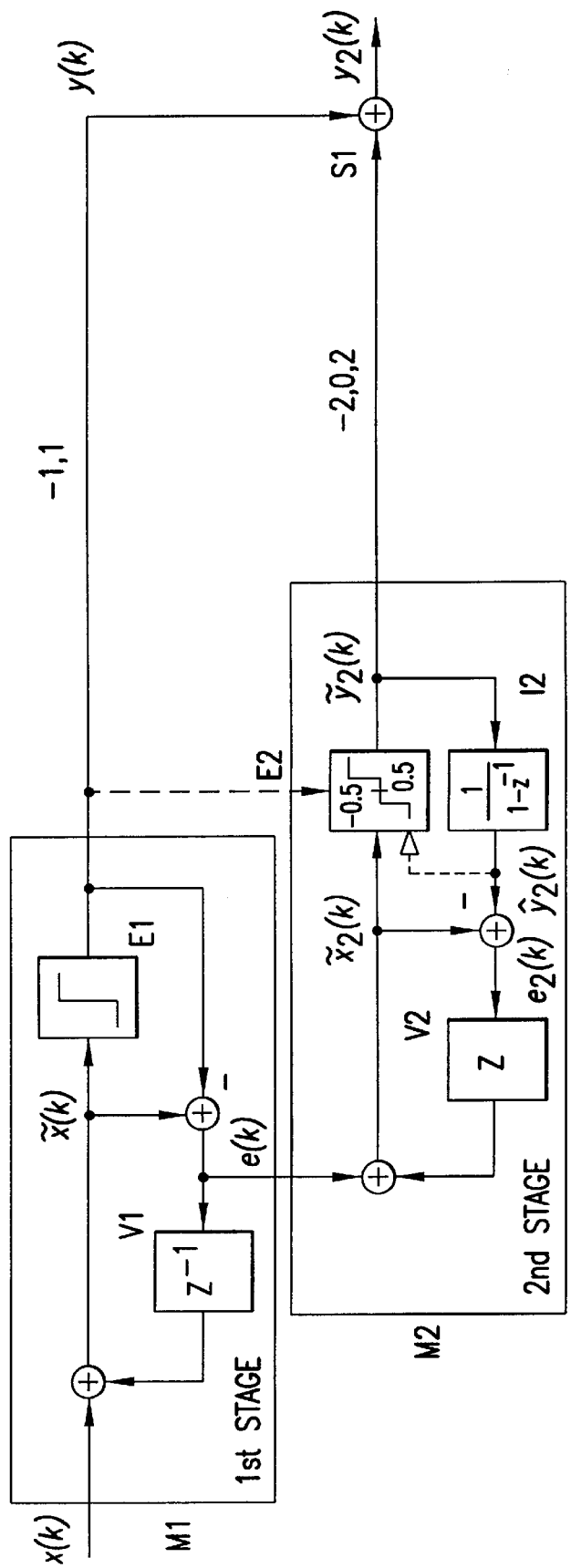
FIG. 2 shows a first exemplary embodiment.

A conditioned cascaded 2nd order sigma-delta modulator with a two-stage output signal (1 bit) is illustrated in FIG. 2 as first exemplary embodiment. The first stage forms a conventional 1st order sigma-delta modulator M1 with a 1-bit output signal (−1, 1), which operates stably in the case of an input signal x(k) in the numerical range: −1<x<+1, of which a decision circuit E1 and a delay device V1 are denoted in more detail. The absolute value of the error signal e(k) is always less than 1, and so an input signal of limited numerical range is provided for the second stage.

The task of the second sigma-delta modulator M2 is to achieve second-order noise shaping of the output signal $y_2(k)$ under the condition, introduced by the invention, that the stage number of $y_2(k)$ is not increased, and $y_2(k)$ is again a 1-bit output signal (−1, +1). Since, because of the summer S1, the relationship $y_2(k)=y(k)+\tilde{y}_2(k)$ holds, the numerical value of the output signal $\tilde{y}_2(k)$ of the filter F2 illustrated in FIG. 1 may assume only the signal values −2, 0, +2 at the instant k.

Two possibilities now exist: firstly, the input signal of the filter (not illustrated in more detail in FIG. 2) in the second sigma-delta modulator M2 can be selected in such a way that the output signal $\tilde{y}_2(k)$ fulfils the abovenamed condition. Secondly, as is illustrated in FIG. 2 as a modification of FIG. 1, the function of the filter F2 according to FIG. 1 can be linked to the function of the second sigma-delta modulator M2. For this purpose, the output signal y(k) of the first sigma-delta modulator M1 is led (dashed connection) to the decision circuit E2 of the second sigma-delta modulator M2. The output signal of the decision circuit E2 is integrated in an integrator I2, and the integration result is compared with the signal to be approximated. The integrator I2 and the decision circuit E2 together form an extended decision circuit with the output signal $\hat{y}_2(k)$. The equations used for the decision process are as follows for the output signal y(k) of the first stage:

$$y(k) = \begin{cases} 1 & \text{if } \tilde{x}(k) \geq 0 \\ -1 & \text{if } \tilde{x}(k) < 0 \end{cases}$$

and for the output signal $\hat{y}_2(k)$ at the integrator I of the second stage:

$$\hat{y}_2(k) =$$

$$\begin{cases} \hat{y}_2(k-1)+2 & \text{if} \quad ((\tilde{x}_2(k) \geq 1) \wedge (y(k) < 1) \wedge (\hat{y}_2(k-1) < 2)) \\ & \qquad \vee ((1 > \tilde{x}_2(k) \geq -1) \wedge (y(k) < 1) \wedge (\hat{y}_2(k-1) < 0)) \\ \hat{y}_2(k-1)-2 & \text{if} \quad ((\tilde{x}_2(k) < 1) \wedge (y(k) > -1) \wedge (\hat{y}_2(k-1) > -2)) \\ & \qquad \vee ((1 > \tilde{x}_2(k) \geq -1) \wedge (y(k) > -1) \wedge (\hat{y}_2(k-1) > 0)) \\ \hat{y}_2(k-1) & \text{else} \end{cases}$$

On the basis of the equations used for the decision process, the integration result $\hat{y}_2(k)$ of the integrator I2 assumes only one of the three numerical values (−2, 0, +2) at the instant k. The integration result $\hat{y}_2(k)$ is subtracted from the signal $\tilde{x}_2(k)$ to be approximated, and the approximation error $e_2(k)$ is therefore calculated. The delay element V2 delays the approximation error $e_2(k)$ by one clock pulse such that said error is added to the input signal of the second stage e (k+1) in the next clock pulse, and the signal $\tilde{x}_2(k+1)$ is calculated.

Figure 3:
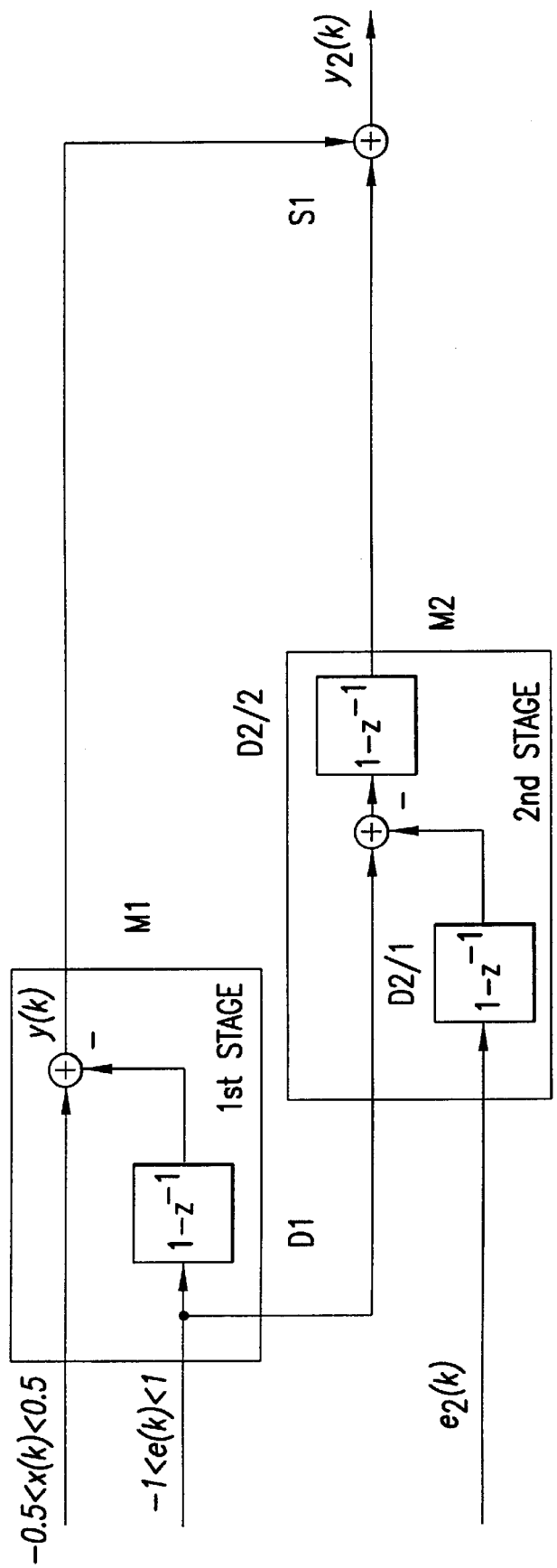
FIG. 3 shows a linear equivalent model for explaining the first exemplary embodiment.

FIG. 3 explains the mode of operation of the cascaded approach with the aid of a linear equivalent model. The first delta-sigma modulator M1 adds an error signal e(k) representing the quantization noise to the original signal x(k) which is shaped by high-pass filtering in accordance with a first-order FIR filter (filter D1). At the same time, this error signal e(k) forms the input signal of the second sigma-delta modulator M2 which, in turn, adds a first-order colored quantization error signal. The spectral formation of the error signal by the filter D2/1 is illustrated. The output signal, differentiated at the differentiator D2/2, of the second sigma-delta modulator M2 is available on the basis of the architecture of the second decision circuit (not illustrated in FIG. 3). It comprises a differentiated error signal of the first stage, which compensates the error in y(k), and a second-order, colored noise signal.

Figure 4:
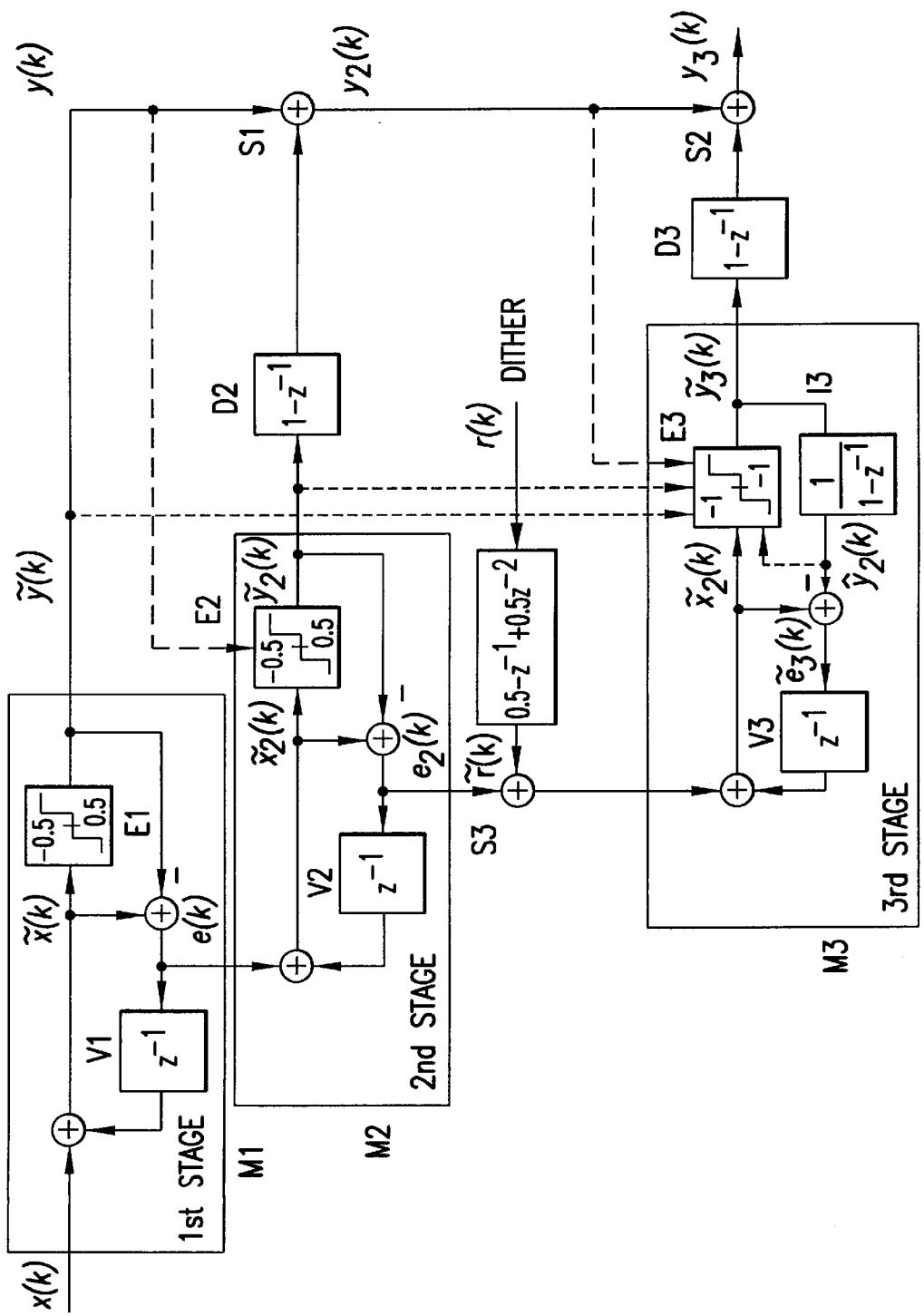
FIG. 4 shows a second exemplary embodiment.

As a further exemplary embodiment, FIG. 4 shows a three stage cascaded first-order sigma-delta modulator with the sigma-delta modulators M1 to M3 and a three-stage output signal $y_3(k)$ of 1.5 bit.

Apart from being fed to a positive input of the summer S1, according to the invention the output signal y(k) of the first sigma-delta modulator M1 is led (dashed line) to an input of the decision circuit E2 of the second sigma-delta modulator M2, which is of analogue design, whose output is led via a differentiator D2 to a second positive input of the summer S1. Present at the output of the summer S1 is the error signal $y_2(k)$ which, apart from being led to a positive input of a summer S2 performing the output error signal $y_3(k)$, is also led according to the invention to the extended decision circuit, formed from the decision circuit E3 and the integrator I3 of the third sigma-delta modulator M3.

In order to suppress discrete interference lines, a dither signal r(k) is added in the summer S3 to the quantization error $e_2(k)$ produced in the second sigma-delta modulator M2, and led to the input of the third sigma-delta modulator M3.

The output of the third sigma-delta modulator M3 is led to the second positive input of the summer S2 via a differentiator D3. The output signal $y_3(k)$ is present at the output of the summer S2 for further processing, for example amplification.

The equations used for the decision process are as follows for the output signal y(k) of the first stage:

$$y(k) = \begin{cases} 1 & \text{if} \quad \tilde{x}(k) \geq 0.5 \\ -1 & \text{if} \quad \tilde{x}(k) \leq -0.5 \\ 0 & \text{else} \end{cases}$$

for the output signal of the second stage:

$$\tilde{y}_2(k) = \begin{cases} 1 & \text{if} \quad (\tilde{x}(k) \geq 0.5) \wedge (y(k) - \tilde{y}_2(k-1) < 1) \wedge (y(k+1) > -1) \\ -1 & \text{if} \quad (\tilde{x}(k) \leq -0.5) \wedge (y(k) - \tilde{y}_2(k-1) > -1) \wedge (y(k+1) < -1) \\ 0 & \text{else} \end{cases}$$

and for the output signal $y_2(k)$ at the integrator I of the third stage:

$$\hat{y}_3(k) = \begin{cases} \hat{y}_3(k) + 1 & \text{if} \quad ((x_3(k) \geq 1) \wedge (y_2(k) - \tilde{y}_3(k-1) < 1) \wedge (y_2(k+1) > -1) \wedge (\hat{y}_3(k-1) < 1)) \\ & \quad \wedge ((1 > x_3(k) \geq -1) \wedge (y_2(k) - \tilde{y}_3(k-1) < 1) \wedge (y_2(k+1) > -1) \wedge (\hat{y}_3(k-1) < 0)) \\ \hat{y}_3(k) - 1 & \text{if} \quad ((x_3(k) < -1) \wedge (y_2(k) - \tilde{y}_3(k-1) > -1) \wedge (y_2(k+1) < 1) \wedge (\hat{y}_3(k-1) > -1)) \\ & \quad \wedge ((1 > x_3(k) \geq -1) \wedge (y_2(k) - \tilde{y}_3(k-1) > -1) \wedge (y_2(k+1) < 1) \wedge (\hat{y}_3(k-1) > 0)) \\ \hat{y}_3(k) & \text{else} \end{cases}$$

In addition, or else as an alternative to the connection, illustrated by dashes, from the output of the summer S1 (output signal $y_2(k)$), the outputs of the sigma-delta modulators M1, M2 of the first and second stage (output signals $\tilde{y}(k)$ and $\tilde{y}_2(k)$, or the output of the differentiator D2) can be led to the decision circuit E3 of the third sigma-delta modulator M3 of the cascade. This is illustrated in FIG. 4 for the third cascade stage by the dotted connections.

Figure 5:
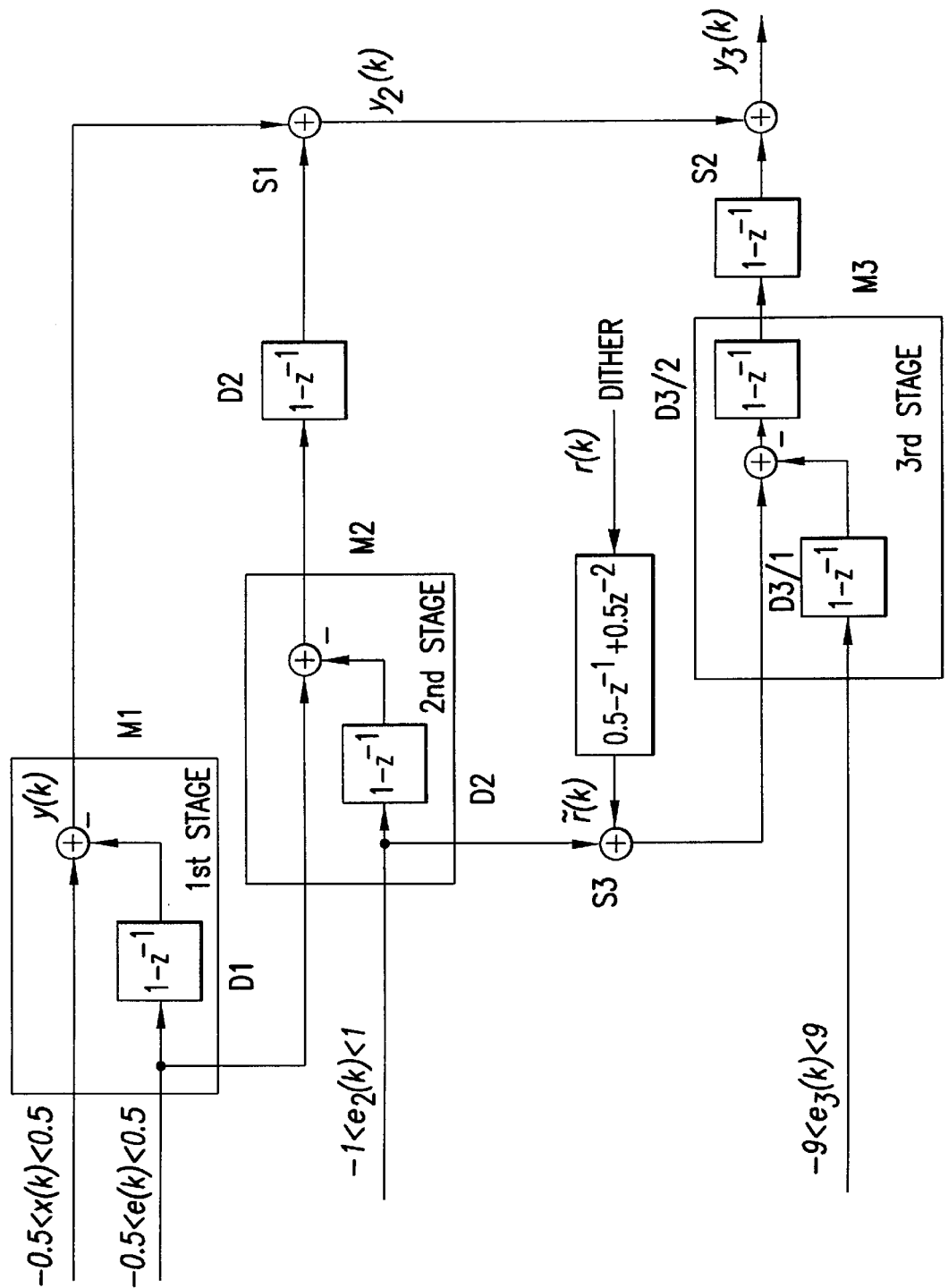
FIG. 5 shows a linear equivalent model for explaining the second exemplary embodiment.

FIG. 5 specifies the linearized model of the modulator according to FIG. 4. Reference may be made to the explanations relating to FIG. 3 concerning the design of the first and second stage with the sigma-delta modulators M1, M2. The quantization error $e_2(k)$ produced in the second sigma-delta modulator M2 is summed in the summer S3 with the aid of a dither signal $\tilde{r}(k)$ and led to the input of the third sigma-delta modulator M3. The output signal $\tilde{y}_3(k)$ produced in the third sigma-delta modulator M3 is differentiated in D3 and added in the signal $y_2(k)$ in the summer S2 for the purpose of error compensation.

The output of the third sigma-delta modulator M3 is led to the second positive input of the summer S2 via a differentiator D3. A low-stage output signal sequence $y_3(k)$ is present at the output of the summer S2 for further processing, for example amplification.

What is claimed is:

1. A cascaded sigma-delta-modulator for inverting time discrete samples into corresponding analog signals in digital radio communication receiving devices, comprising:
   n cascaded sigma-delta-modulators;
   a first sigma-delta-modulator in the cascade, including:
      a first error signal, representing the quantization noise,
      a first decision circuit building an output signal of the first sigma-delta-modulator,
   where $1 < i \leq n$ is an ith sigma-delta-modulator in the cascade,
      having an ith error signal, and
      having an ith decision circuit building the output signal of the ith sigma-delta-modulator,
   the error signal of the i-1th sigma-delta-modulator being fed to the ith sigma-delta-modulator in the cascade,
   the output signals of preceding i-1th sigma-delta-modulators being fed directly to the ith decision circuit of the ith sigma-delta-modulator of the cascade.

2. The cascaded sigma-delta modulator as claimed in claim 1, wherein the output signal $y_i(k)$ has a number of the signal states reduced to two.

3. The cascaded sigma-delta modulator as claimed in claim 1, wherein cascade stages are provided arbitrarily.

4. The cascaded sigma-delta modulator as claimed in claim 1, wherein the decision circuit of at least one stage of the cascade is extended by an integrator.

5. The cascaded sigma-delta modulator as claimed in claim 1, wherein the decision circuit of at least one stage of the cascade is extended by an integrator, and the output value of the integrator is limited to a minimum or a maximum value.

6. The cascaded sigma-delta modulator as claimed in claim 1, wherein a dither signal $\bar{i}(k)$ is added to the input signal of the last stage of the cascade.

7. The cascaded sigma-delta modulator as claimed in claim 1, wherein the decision circuit of the last stage of the cascade is influenced by a dither signal $\bar{i}k$.

8. The cascaded sigma-delta modulator as claimed in claim 1, wherein the output signal $\hat{y}_{i-1}(k)$ of preceding cascade stages is fed, in addition to or instead of the summed output signal $y_{i-1}(k)$ of preceding i-1 sigma-delta modulators, to the decision circuit of the ith sigma-delta modulator of the cascade.

* * * * *